US012604436B2

(12) United States Patent
Li et al.

(10) Patent No.: US 12,604,436 B2
(45) Date of Patent: Apr. 14, 2026

(54) METHOD FOR ACHIEVING SCALABLE TWO-PHASE COOLING PLATES

(71) Applicant: UNIVERSITY OF SOUTH CAROLINA, Columbia, SC (US)

(72) Inventors: Chen Li, Chapin, SC (US); Wei Chang, Columbia, SC (US); Enrico Santi, Columbia, SC (US); Bo Tian, Columbia, SC (US)

(73) Assignee: UNIVERSITY OF SOUTH CAROLINA, Columbia, SC (US)

( * ) Notice: Subject to any disclaimer, the term of this patent is extended or adjusted under 35 U.S.C. 154(b) by 602 days.

(21) Appl. No.: 17/980,976

(22) Filed: Nov. 4, 2022

(65) Prior Publication Data

US 2023/0403822 A1 Dec. 14, 2023

Related U.S. Application Data

(60) Provisional application No. 63/296,986, filed on Jan. 6, 2022.

(51) Int. Cl.
| | |
|---|---|
| *H05K 7/20* | (2006.01) |
| *F28D 15/02* | (2006.01) |
| *F28D 15/04* | (2006.01) |

(52) U.S. Cl.
CPC ..... *H05K 7/20327* (2013.01); *F28D 15/0233* (2013.01); *F28D 15/046* (2013.01); *H05K 7/20309* (2013.01); *F28D 2015/0225* (2013.01)

(58) Field of Classification Search
CPC ............ H05K 7/20327; H05K 7/20309; F28D 15/0233; F28D 15/046; F28D 2015/0225; H01L 23/427
See application file for complete search history.

(56) References Cited

U.S. PATENT DOCUMENTS

| | | | |
|---|---|---|---|
| 9,139,416 B2 | 9/2015 | Li et al. | |
| 10,386,133 B2 | 8/2019 | Li et al. | |
| 11,340,024 B2 | 5/2022 | Li et al. | |
| 2002/0108743 A1* | 8/2002 | Wirtz .................. H01L 23/3733 | |
| | | | 257/722 |
| 2004/0190253 A1* | 9/2004 | Prasher ................. H01L 23/427 | |
| | | | 361/699 |
| 2008/0259566 A1* | 10/2008 | Fried .................. H05K 7/20809 | |
| | | | 165/80.4 |

(Continued)

OTHER PUBLICATIONS

Cheng and Mewes, Review of two-phase flow and flow boiling of mixtures in small and mini channels, International Journal of Multiphase Flow 32, 183-207, 2006. (Year: 2006).*

*Primary Examiner* — Jeffrey T Carley
*Assistant Examiner* — Jose K Abraham
(74) *Attorney, Agent, or Firm* — DORITY & MANNING, P.A.

(57) ABSTRACT

Effective two-phase cooling is provided to large devices even with a length of ~10 cm due to a channel configuration to achieve formed minichannels comprising porous wall structures. Baseplate features comprise a substrate defining the minichannels, with each minichannel formed between a pair of side walls and a bottom surface thereof. The side walls of the plurality of minichannels respectively form terminal walls for each of the respective minichannels. A microgap configuration is formed between the terminal wall of at least one of the plurality of minichannels and an adjacent layer.

25 Claims, 16 Drawing Sheets

(56) References Cited

U.S. PATENT DOCUMENTS

| | | | |
|---|---|---|---|
| 2009/0056917 A1* | 3/2009 | Majumdar | F28D 15/0233 165/104.26 |
| 2013/0027878 A1* | 1/2013 | Campbell | H05K 7/20772 165/185 |
| 2013/0027883 A1* | 1/2013 | Campbell | H05K 7/20318 165/185 |
| 2013/0027884 A1* | 1/2013 | Campbell | H05K 7/20818 165/104.21 |
| 2014/0027005 A1 | 1/2014 | Li et al. | |
| 2015/0009631 A1* | 1/2015 | Joshi | H01L 23/427 361/717 |
| 2016/0118317 A1* | 4/2016 | Shedd | F28F 9/26 257/712 |
| 2018/0031330 A1* | 2/2018 | Roberts | F28D 15/046 |
| 2020/0370840 A1 | 11/2020 | Li et al. | |
| 2021/0123641 A1* | 4/2021 | Monazami | F28D 15/0275 |
| 2022/0074680 A1* | 3/2022 | Tung | F28D 15/0233 |

* cited by examiner

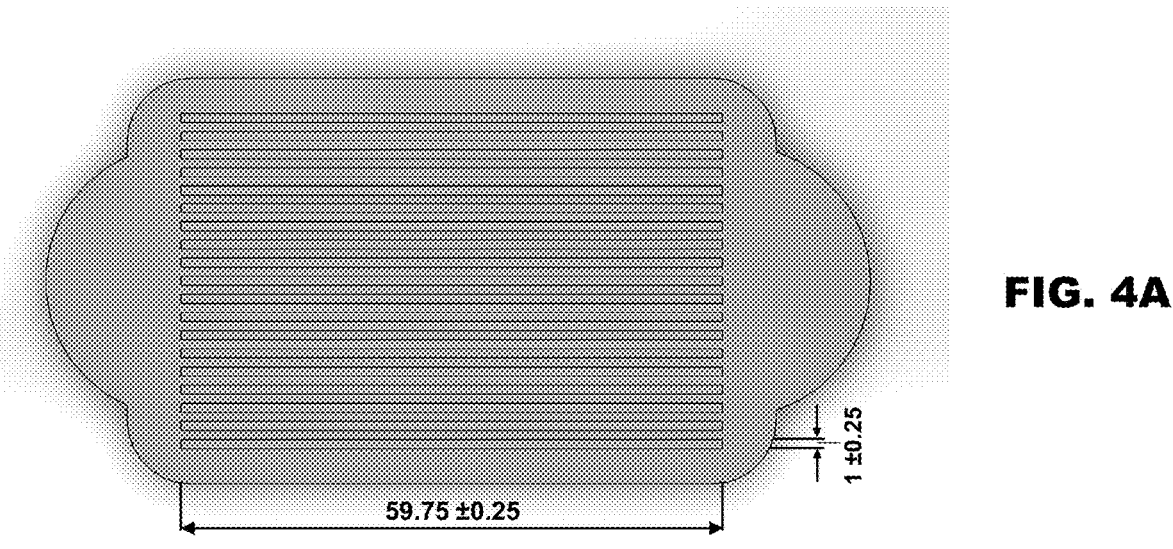
FIG. 4A
Cross-Section View
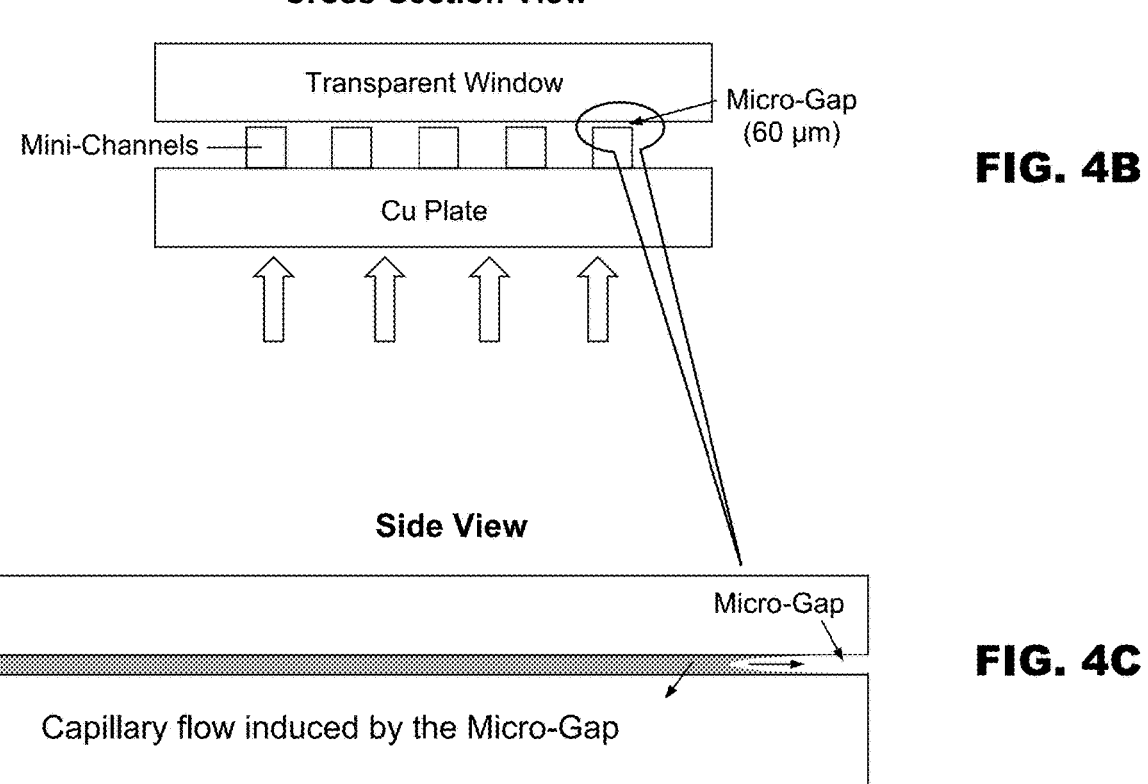
FIG. 4B
FIG. 4C

Flow direction

Conventional Mini-Channel

Flow direction

Mini-Channel with Micro-Gap

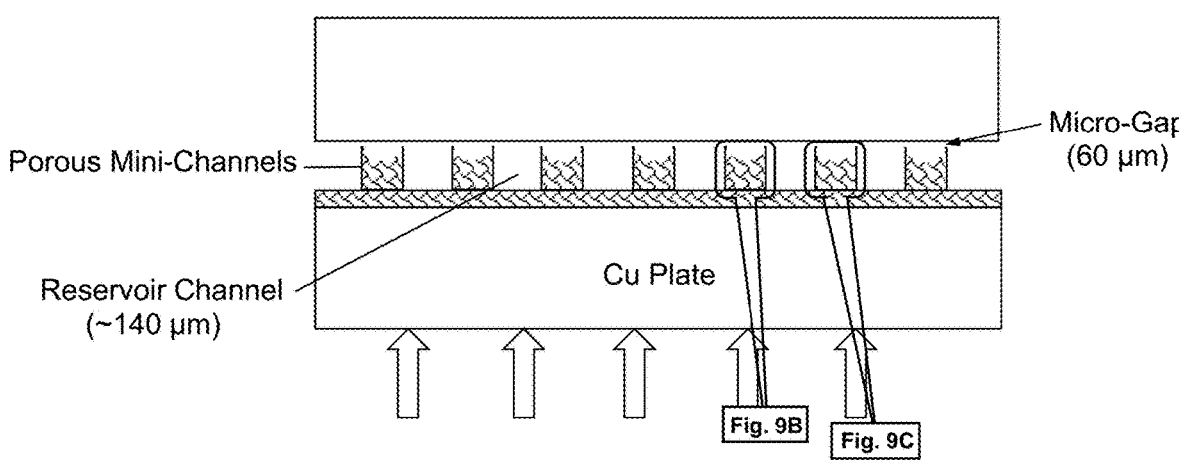
Porous Mini-Channels
Reservoir Channel
(~140 µm)
Cu Plate
Micro-Gap
(60 µm)
Fig. 9B
Fig. 9C
FIG. 9A
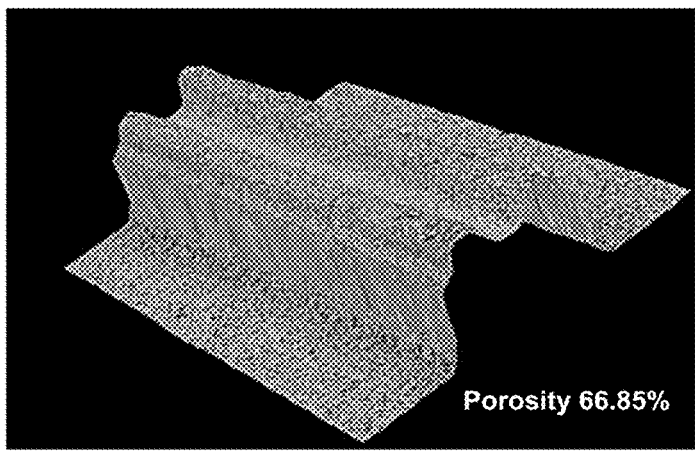
Porosity 66.85%
FIG. 9B
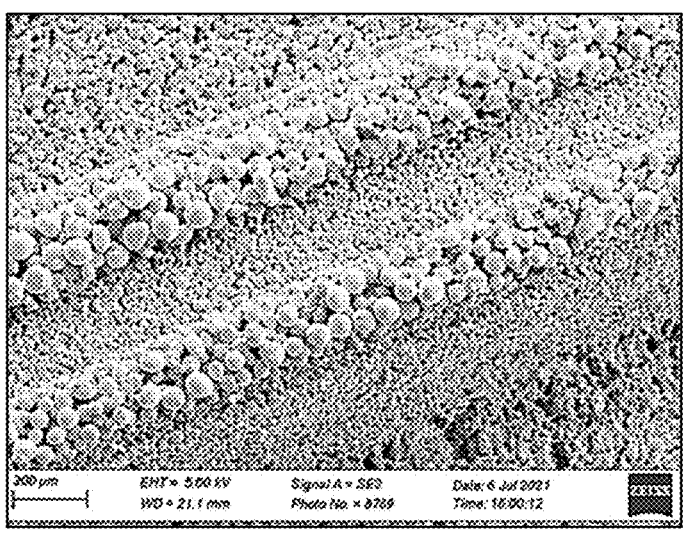
FIG. 9C

Flow direction

Main channel

Porous wall with
reservoir channel

Side View

Top View

Minichannel region

METHOD FOR ACHIEVING SCALABLE TWO-PHASE COOLING PLATES

PRIORITY CLAIM

The present application claims the benefit of priority of U.S. Provisional Patent Application No. 63/296,986, titled "Scalable Two-Phase Cooling Plates," filed Jan. 6, 2022, and which is fully incorporated herein by reference for all purposes.

STATEMENT REGARDING SPONSORED RESEARCH OR DEVELOPMENT

This invention was made with government support under N00014-16-1-2956, awarded by the Office of Naval Research (ONR). The government has certain rights in the invention.

BACKGROUND OF THE PRESENTLY DISCLOSED SUBJECT MATTER

In the past, several microchannel configurations were developed to realize two-phase cooling for high-power electronics, but these were limited to small devices with sizes at ~cm length. It has been a challenge to implement effective two-phase cooling to large devices with a length of ~10 cm due to notorious scaling effects.

The microelectronic chip size is ~1 cm by ~1 cm. However, the functional device assembled from multiple chips is 100 times larger in area. It is highly desirable to realize effective cooling at the device or component level.

The major technical barrier that hinders the implementation of two-phase cooling from the chip level (small sizes) to component level (relatively large sizes) is the global liquid supply, which gets worse with the increase of channel length. Two-phase cooling usually fails at relatively low heat loads due to the loss of liquid supply. In some two-phase cooling systems, heat is transferred by the evaporation and condensation of a portion or all of the working fluid. For example, a liquid near-saturation may be pumped into a cold plate, where it starts to boil, cooling the electronics and storing the energy in the latent heat of the fluid.

The potential impact of the technical problems addressed herein are relatively significant. For example, cold plates are adopted in electronic devices from commercial products to personal electronics. Such applications include, but are not limited to, data centers, electric motors, batteries, power electronics, etc. The global market size is approximately $10 billion.

Examples of published patent-related documents relating to technology addressing heat-related issues include US Publication Nos. 2014/0027005 and 2020/0370840, and U.S. Pat. Nos. 9,139,416, 10,386,133, and 11,340,024, the complete disclosures of all of which are fully incorporated herein and for all purposes.

SUMMARY OF THE PRESENTLY DISCLOSED SUBJECT MATTER

Aspects and advantages of the presently disclosed subject matter will be set forth in part in the following description, or may be apparent from the description, or may be learned through practice of the presently disclosed subject matter.

Broadly speaking, the presently disclosed subject matter relates to improved heat sinks and cold plates, and in particular, to improved two-phase cooling plates. Further, in particular, the presently disclosed subject matter relates to improved two-phase cooling plates which are scalable (meaning capable of implementation with relatively larger sizes).

Presently disclosed subject matter relates to a novel channel configuration to achieve effective two-phase cooling on devices with an area of ~10 cm by ~5 cm or larger, which is the prevailing size of major commercial electronics and power electronics devices. In a lab environment, we demonstrated that the novel channel configuration can meet their cooling needs.

It is to be understood from the complete disclosure herewith that the presently disclosed subject matter equally relates to both apparatus and corresponding and related methodology. Thus, subject matter of the present disclosure includes both a greatly improved fabrication process and a resulting and/or associated devised new structure to implement effective two-phase cooling solutions to larger areas. It is critical for the marketplace to realize effective two-phase cooling from chip level to component level, and even to system level.

Here, we devised an auxiliary channel on the top of each channel wall. With careful design of the channel height, liquid can be effectively supplied from inlet to outlet, even at extremely high heat loads, which greatly delays the loss of liquid supplies in conventional channel configurations and enables highly effectively two-phase cooling on an area of ~10 cm by ~5 cm. An improved version was developed to enhance local wetting that further improves the cooling effectiveness on the same working areas.

Subject matter disclosed herewith is a first generation of two-phase cooling plates that are ready to be commercialized. Two-phase cooling technologies have been stuck by severe two-phase flow instabilities. Such instabilities are at least partly addressed by patent documents referenced herein, but in microchannels. For real world or practical applications, two-phase cooling technologies need to match the size of electronic components; however, the scalability of two-phase flow is very poor. Here, we successfully address the scalability issue and make it feasible to cool large electronic devices.

One presently disclosed exemplary methodology preferably relates to achieving effective two-phase cooling on electronic devices having an area of one cm by one cm or larger, comprising integrating at least one minichannel structure directly associated with baseplate features of the electronic devices.

One presently disclosed exemplary embodiment relates to an electronic device for use with two-phase cooling, comprising an electronic device having an area of one cm by one cm or larger, and having a baseplate with at least one minichannel structure directly integrated therein, for improved two-phase cooling when used in conjunction with cooling fluid flow.

Additional objects and advantages of the presently disclosed subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments, uses, and practices of the presently disclosed subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the presently disclosed subject matter may include various combinations or configurations of presently disclosed features, steps, or elements, or their equivalents (including combinations of features, parts, or steps or configurations thereof not expressly shown in the Figures or stated in the detailed description of such Figures). Additional embodiments of the presently disclosed subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification, and will appreciate that the presently disclosed subject matter applies equally to corresponding methodologies as associated with practice of any of the present exemplary devices, and vice versa.

BRIEF DESCRIPTION OF THE FIGURES

A full and enabling disclosure of the presently disclosed subject matter, including the best mode thereof, directed to one of ordinary skill in the art, is set forth in the specification, which makes reference to the appended figures, in which:

FIG. 4A illustrates a device fabricated with particular channel lengths, widths, and depths in accordance with presently disclosed subject matter;

FIG. 4B illustrates an enlarged cross-sectional view schematic of the presently disclosed subject matter of FIG. 4A, including use of a presently disclosed microgap feature thereof;

FIG. 4C illustrates an enlarged side view schematic of the presently disclosed subject matter of FIG. 4A, including use of a presently disclosed microgap feature thereof;

FIGS. 9A through 9C respectively illustrate graphics, image, and enlarged image representations of exemplary embodiments of presently disclosed subject matter particularly for addressing local liquid spreading;

Figure 1A:
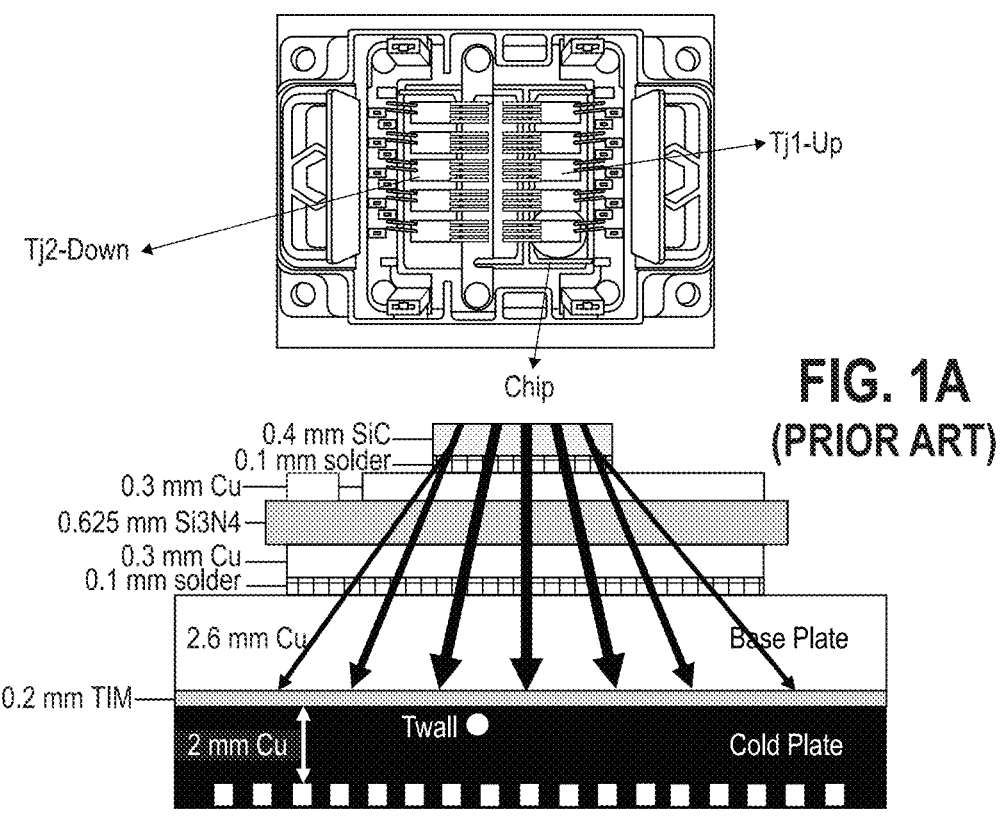
FIG. 1A illustrates an image/schematic layer cross-section of a representative exemplary power module cooled by conventional minichannel technology.

Repeat use of reference characters in the present specification and figures is intended to represent the same or analogous features or elements or steps of the presently disclosed subject matter.

DETAILED DESCRIPTION OF THE PRESENTLY DISCLOSED SUBJECT MATTER

It is to be understood by one of ordinary skill in the art that the present disclosure is a description of exemplary embodiments only and is not intended as limiting the broader aspects of the disclosed subject matter. Each example is provided by way of explanation of the presently disclosed subject matter, not limitation of the presently disclosed subject matter. In fact, it will be apparent to those skilled in the art that various modifications and variations can be made in the presently disclosed subject matter without departing from the scope or spirit of the presently disclosed subject matter. For instance, features illustrated or described as part of one embodiment can be used with another embodiment to yield a still further embodiment. Thus, it is intended that the presently disclosed subject matter covers such modifications and variations as come within the scope of the appended claims and their equivalents.

The present disclosure is generally directed to improved two-phase cooling plates. Further, in particular, the presently disclosed subject matter relates to improved two-phase cooling plates which are scalable (meaning capable of implementation with relatively larger sizes).

5

6

Figure 1B:
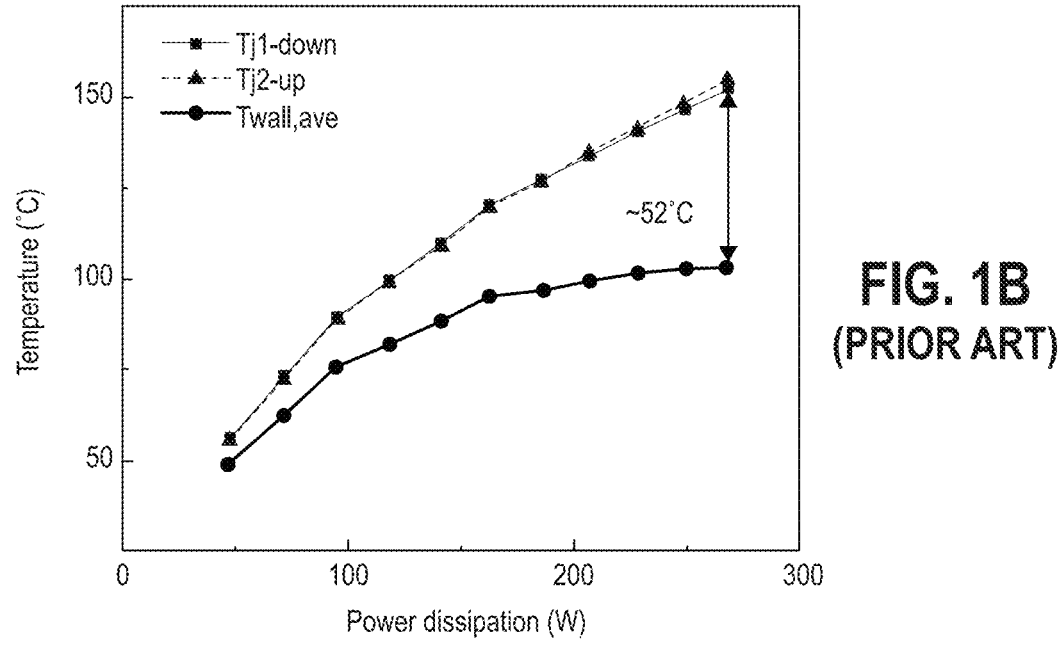
FIG. 1B graphically illustrates drawback of chip temperature for the arrangement of FIG. 1A.

More specifically, FIG. 1A illustrates an image (upper portion of Figure) and schematic layer cross-section (lower portion of Figure) of a representative exemplary power module cooled by conventional minichannel technology. FIG. 1A shows where junction temperatures (Tj) 1 and 2 are situated on the exemplary devices. As understood by those of ordinary skill in the art, junction temperature is the temperature at joints on a semiconductor chip. FIG. 1B graphically illustrates drawback of chip temperature for the arrangement of FIG. 1A, based on a flowrate of water 25 ml/min, and involving as an example a Wolfspeed power module.

Figure 2:
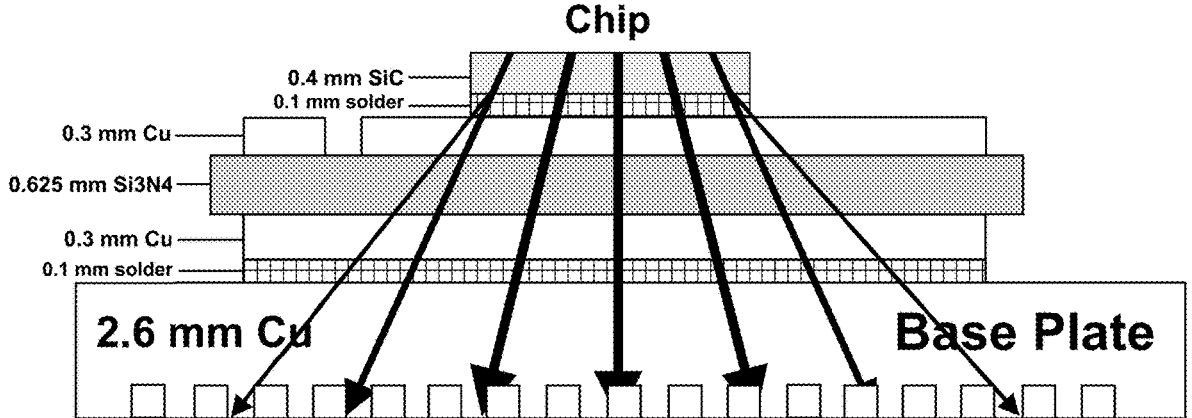
FIG. 2 illustrates a schematic layer/cross-section of a representative exemplary power module cooled by presently disclosed technology.

FIG. 2 illustrates a schematic layer/cross-section of a representative exemplary power module cooled by presently disclosed technology. As illustrated and represented, comparing FIG. 2 with conventional (prior art) FIG. 1, the cold plate layer and the thermal interface material (TIM) of FIG. 1 are omitted. Also, as illustrated, minichannels are directly integrated in/on the backside (baseplate) of the power module. Such presently disclosed subject matter of the FIG. 2 configuration advantageously results in an approximate 35% reduction of total thermal resistance over that of the FIG. 1 configuration.

Generally speaking, advantages of two-phase cooling as presently disclosed provides relatively increased module power density. With both the baseplate and thermal interface material (TIM) eliminated, the thermal power is increased.

Another resulting advantage is increased lifetime. For example, two-phase cooling can reduce junction temperature excursion $\Delta TJ$ during thermal cycling, increasing the number of allowable thermal cycles by more than 400×.

Yet another resulting advantage is improved thermal uniformity. In other words, there is a reduction of temperature difference between chips, which enhances reliability of power module.

Still further, the presently disclosed configuration advantageously reduces required cooling fluid flow rate. The required two-phase cooling flow rate of 25 ml/min is reduced by 300× compared to a conventional cold plate, requiring 8 L/min.

Also, system size and weight can be advantageously reduced. The 300× reduction in cooling flow rate brings a huge reduction in sizes of the pump, heat exchangers, and coolant piping.

Presently disclosed subject matter addresses challenges in implementing minichannel flow boiling cooling. For example, one issue relates to scaling effect, which involves created difficulties when trying to go from sizes of about a centimeter to about ten centimeters, which can be problematic due to poor liquid supplies at both global and local level. Microchannel up to 1000 W/cm$^2$ and minichannels to about 50-1000 W/cm$^2$ and may be referenced.

Other issues may relate to two-phase instabilities, such as local dryout and oscillations of both temperature and pressure drops.

Presently disclosed subject matter considers and investigates solutions such as micro-gap structure being provided an auxiliary liquid supply. Another approach relates to use of a porous minichannel structure with reservoir channel to mitigate dry out and improve local liquid spreading.

Further, yet another approach relates to a minichannel structure realized directly on the module baseplate in order to eliminate thermal interfacial resistance associated with conventional cold plates, and to reduce weight.

Figure 3A:
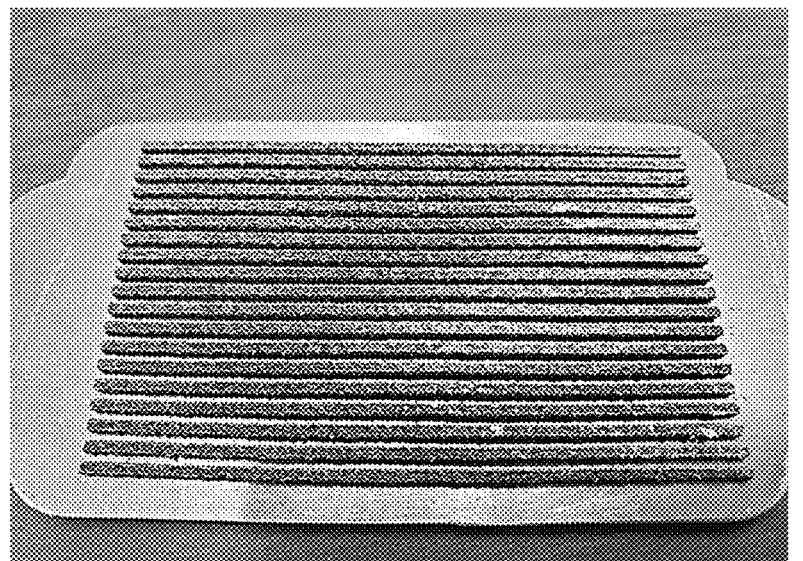
FIGS. 3A through 3C respectively illustrate images of devices with a) smooth wall b) slot and c) porous wall features, respectively, fabricated in accordance with presently disclosed subject matter.
Figure 3B:
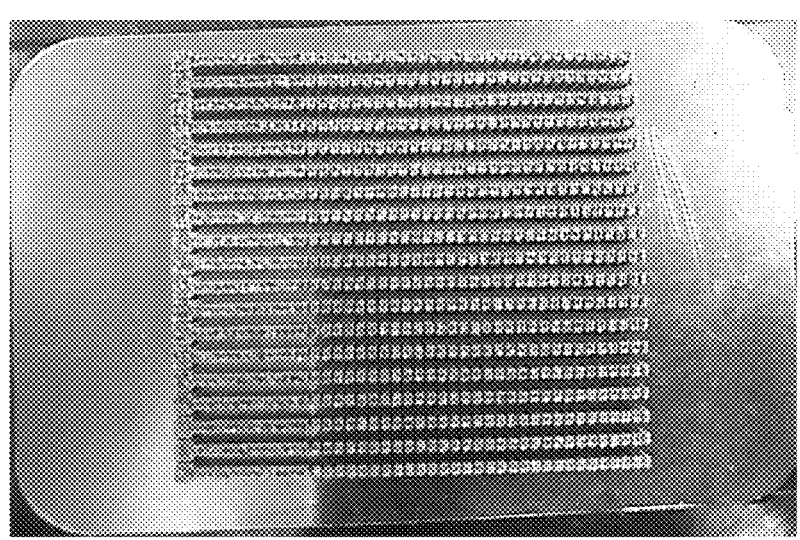
Figure 3C:
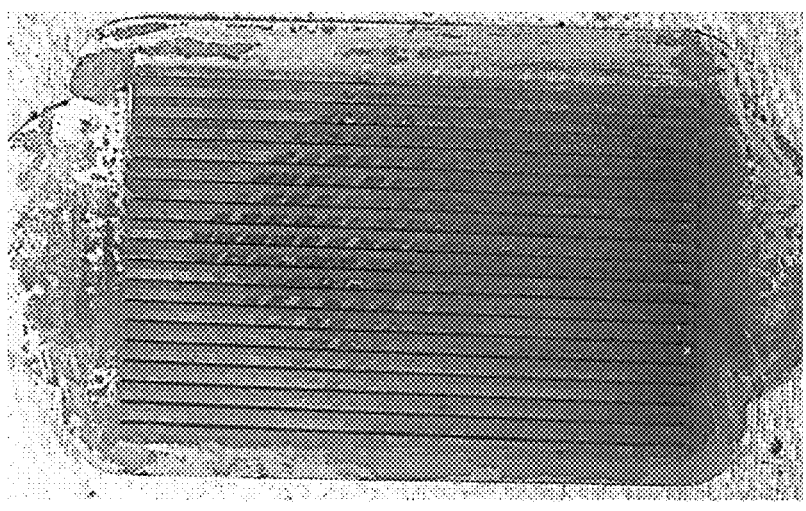

FIGS. 3A through 3C respectively illustrate images of devices with a) smooth wall b) slot and c) porous wall features, respectively, fabricated in accordance with presently disclosed subject matter. FIGS. 3A through 3C in fact comprise prototypes for minichannel evaluation. In particular, the minichannels with smooth wall and slot structures were fabricated by 3-D printing. The minichannels with porous wall structures were made from copper sintering.

FIGS. 4A through 4C relate to presently disclosed concepts of two-phase cooling to address global liquid supply. Specifically, FIG. 4A illustrates a device fabricated with particular channel lengths, widths, and depths in accordance with presently disclosed subject matter. Those particular Cu channel length×width×depth measurements for this exemplary embodiment as shown are: 59.75 mm×1 mm×1 mm.

FIG. 4B illustrates an enlarged cross-sectional view schematic of the presently disclosed subject matter of FIG. 4A, including use of a presently disclosed microgap feature thereof. The microgap features are in addition to the illustrated minichannel features. The exemplary microgap represented is 60 µm. FIG. 4C illustrates an enlarged side view schematic of the presently disclosed subject matter of FIG. 4A, including use of the presently disclosed microgap feature thereof. As shown, capillary flow is induced by the microgap configuration, which is situated in a partial space between the minichannel face of the baseplate and an associated transparent window.

Figure 5A:
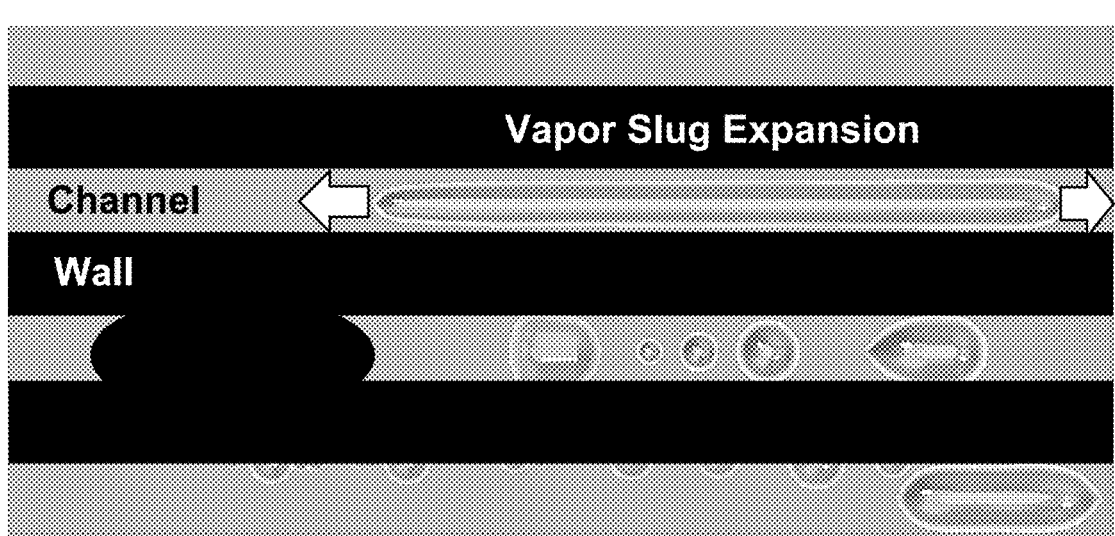
FIG. 5A schematically illustrates an exemplary device cooled by conventional minichannel technology in conjunction with associated flow direction.
Figure 5B:
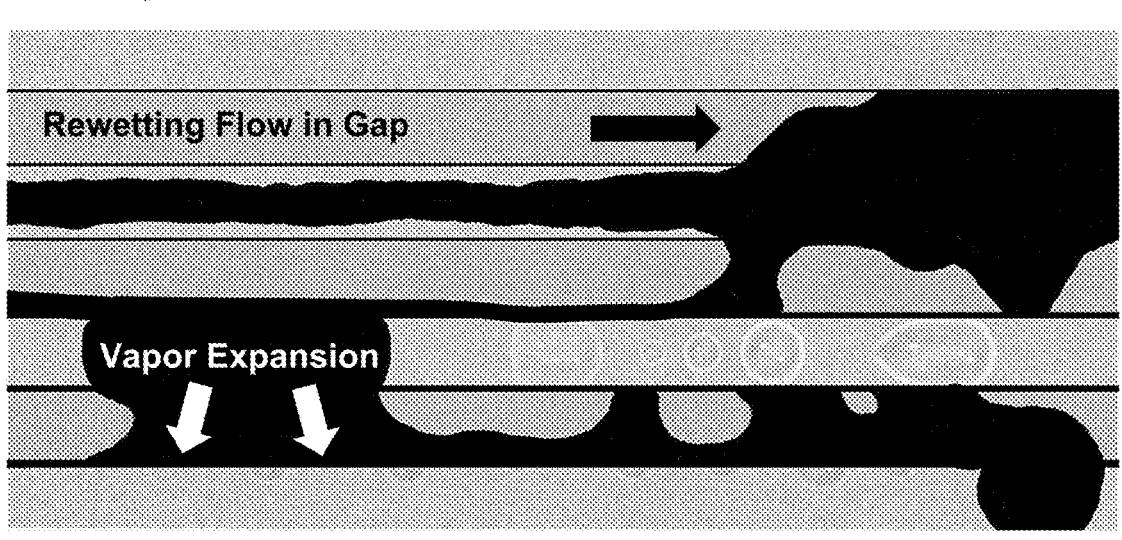
FIG. 5B schematically illustrates an exemplary device cooled by presently disclosed technology with presently disclosed microgap, in conjunction with associated flow direction.

Both FIGS. 5A and 5B illustrate a left to right flow direction designation in conjunction with the represented device configurations. In particular, FIG. 5A schematically illustrates an exemplary device cooled by conventional minichannel technology in conjunction with associated flow direction, while FIG. 5B schematically illustrates an exemplary device cooled by presently disclosed technology with presently disclosed microgap, in conjunction with associated flow direction.

FIG. 5A (based on conventional subject matter) represents vapor slug expansion in both lateral directions (left and right) along a channel feature interspersed with wall features. FIG. 5B (based on presently disclosed subject matter) represents rewetting flow achieved in the added gap feature, with vapor expansion occurring in a direction perpendicular to the represented flow direction.

Figure 6:
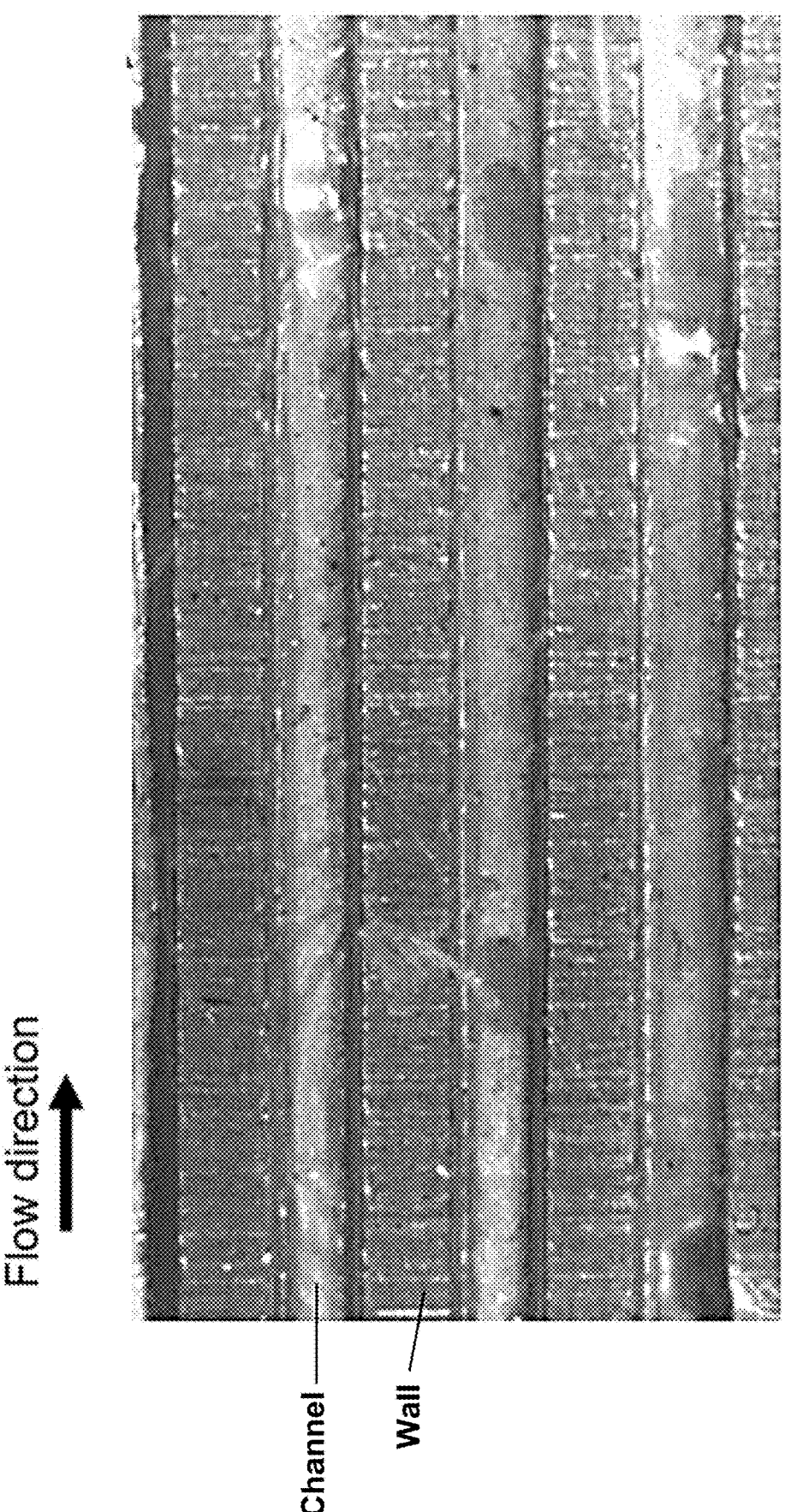
FIG. 6 illustrates visualization of an exemplary device cooled by presently disclosed technology with presently disclosed designed gaps, in conjunction with associated flow direction at flow rate of 25 ml/min.

FIG. 6 illustrates visualization of an exemplary device cooled by presently disclosed technology with presently disclosed designed gaps, and alternating channel and wall features. The subject configuration is visualized in conjunction with associated flow direction at flow rate of 25 ml/min for a 650 Watt configuration (50 fps, video taken at 1000 fps).

Figure 7A:
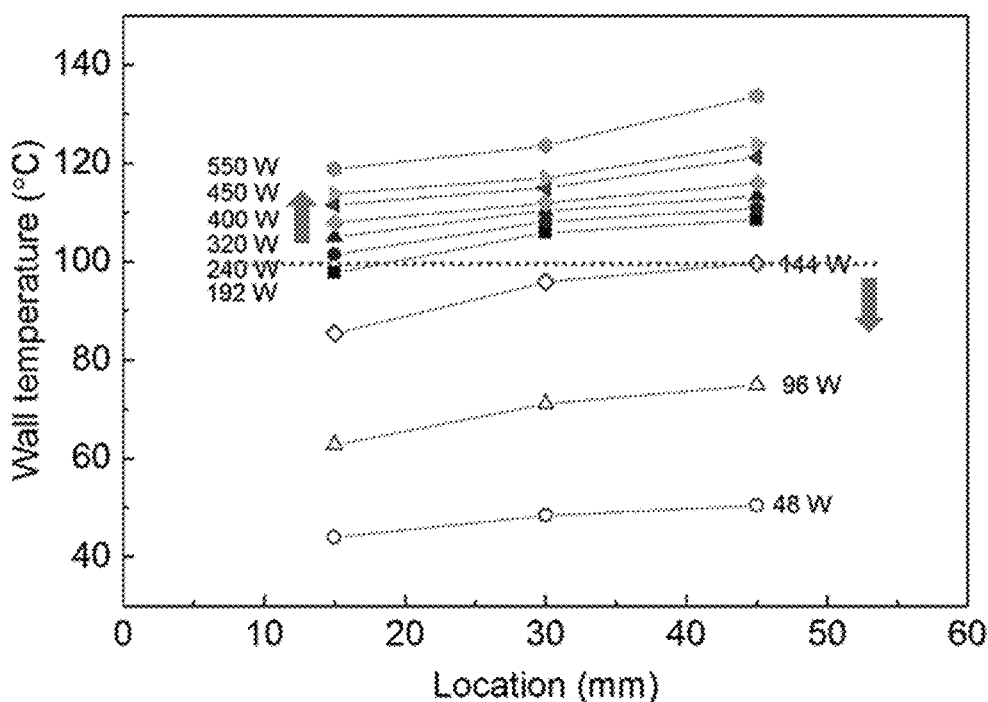
FIG. 7A graphically represents the super-cooling capability of conventional minichannel technology.
Figure 7B:
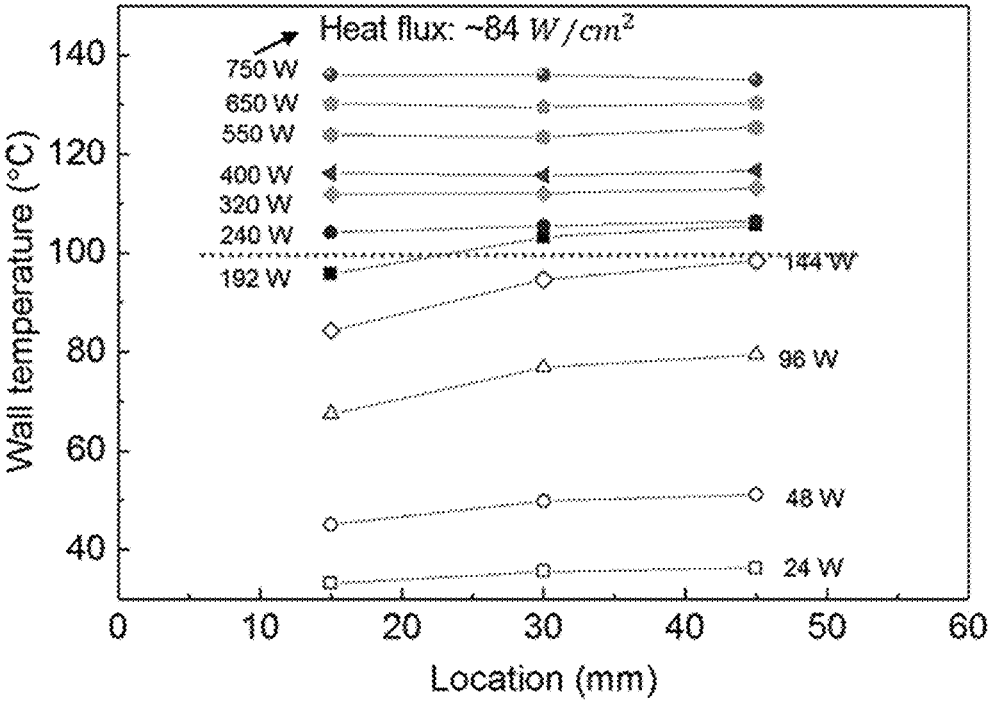
FIG. 7B graphically represents the super-cooling capability of presently disclosed technology with presently disclosed microgap features.

FIGS. 7A and 7B highlight and contrast respective super-cooling capabilities of conventional and presently disclosed subject matter. In particular, FIG. 7A graphically represents the super-cooling capability of conventional minichannel technology, while FIG. 7B graphically represents the super-cooling capability of presently disclosed technology with presently disclosed microgap features. Both graphs are associated with a cooling water flowrate of 25 ml/min. Both FIGS. 7A and 7B graph wall temperature versus location.

Figure 8A:
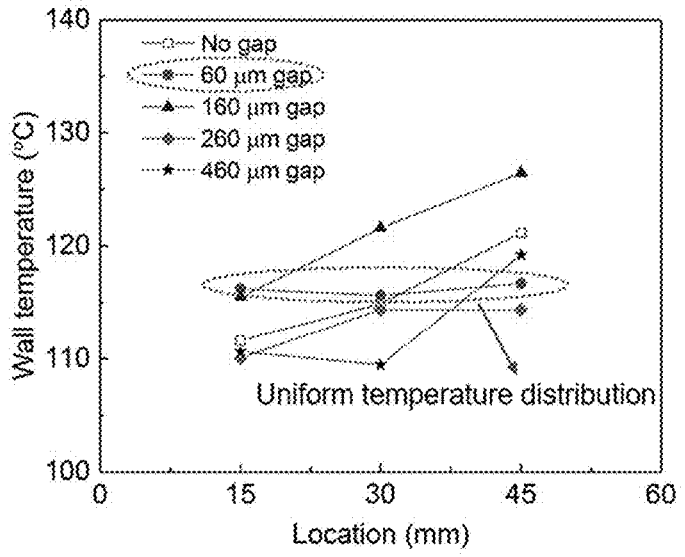
FIG. 8A graphically represents results using various gap embodiments, and reflecting optimal gap thickness resulting with the 60 μm-gap embodiment, which has capillary flow providing the best performance.

FIG. 8A graphically represents results using various gap embodiments in a 400 Watt configuration, with cooling water flow of 25 ml/min. As graphically shown, an optimal gap thickness results with the 60 µm-gap embodiment, which means there is capillary flow providing the best performance.

Figure 8B:
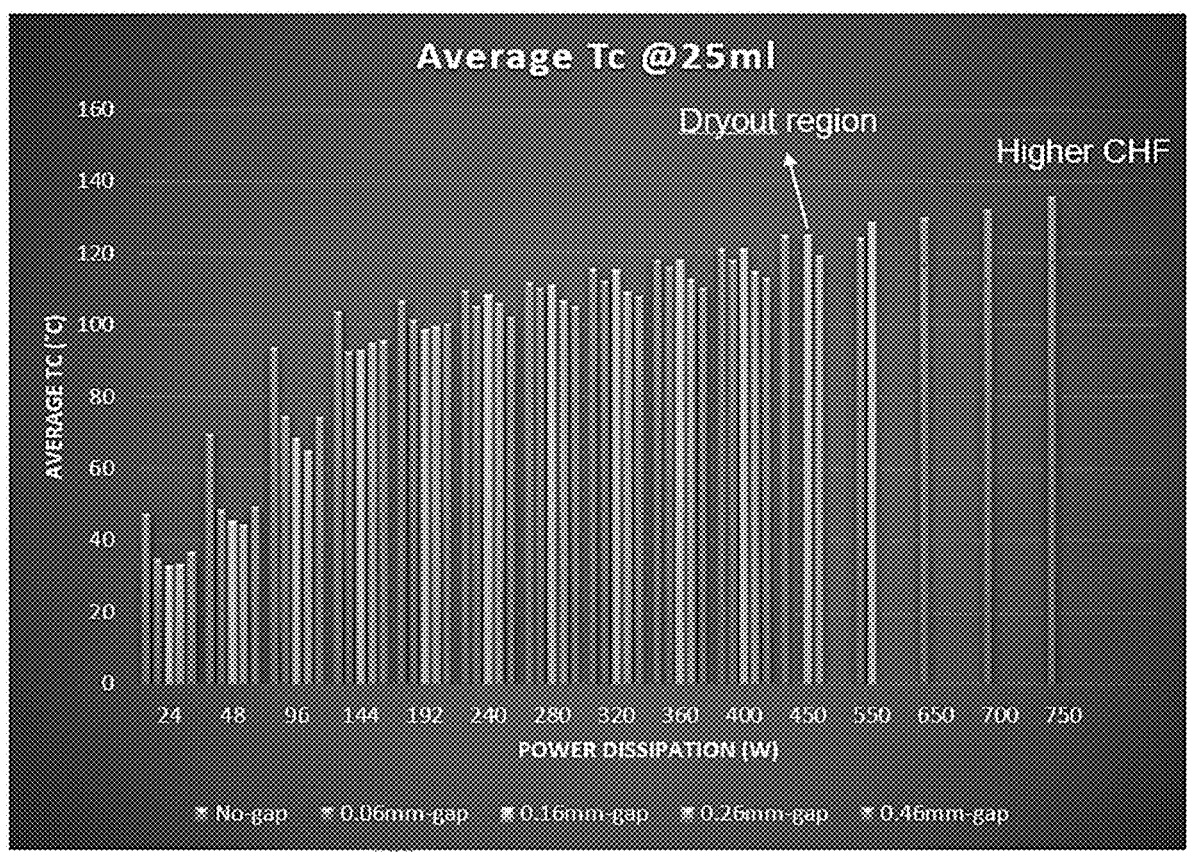
FIG. 8B graphically represents critical heat flux (CHF) results from presently disclosed subject matter.

FIG. 8B graphically represents critical heat flux (CHF) results from presently disclosed subject matter, graphing average Tc versus power dissipation (in Watts).

FIGS. 9A through 9C respectively illustrate graphics, image, and enlarged image representations of exemplary embodiments of presently disclosed subject matter particularly for addressing local liquid spreading. In particular, such improved embodiment to address local liquid spreading makes use of porous minichannel configurations, as represented in FIG. 9A. The reservoir channels may be preferably about 140 μm. Such sizing may be practiced again with the presently disclosed 60 μm gap configuration. The enlarged segment represented by FIG. 9B illustrates one exemplary porosity of about 66.85%, and more closely shows the top-most positioning of the reservoir channel. A range of mostly porous porosities (that is, above 50%) may be practiced. FIG. 9C illustrates an enlarged electron scan of the associated materials, taken of a portion of FIG. 9A, as illustrated.

Figure 10:
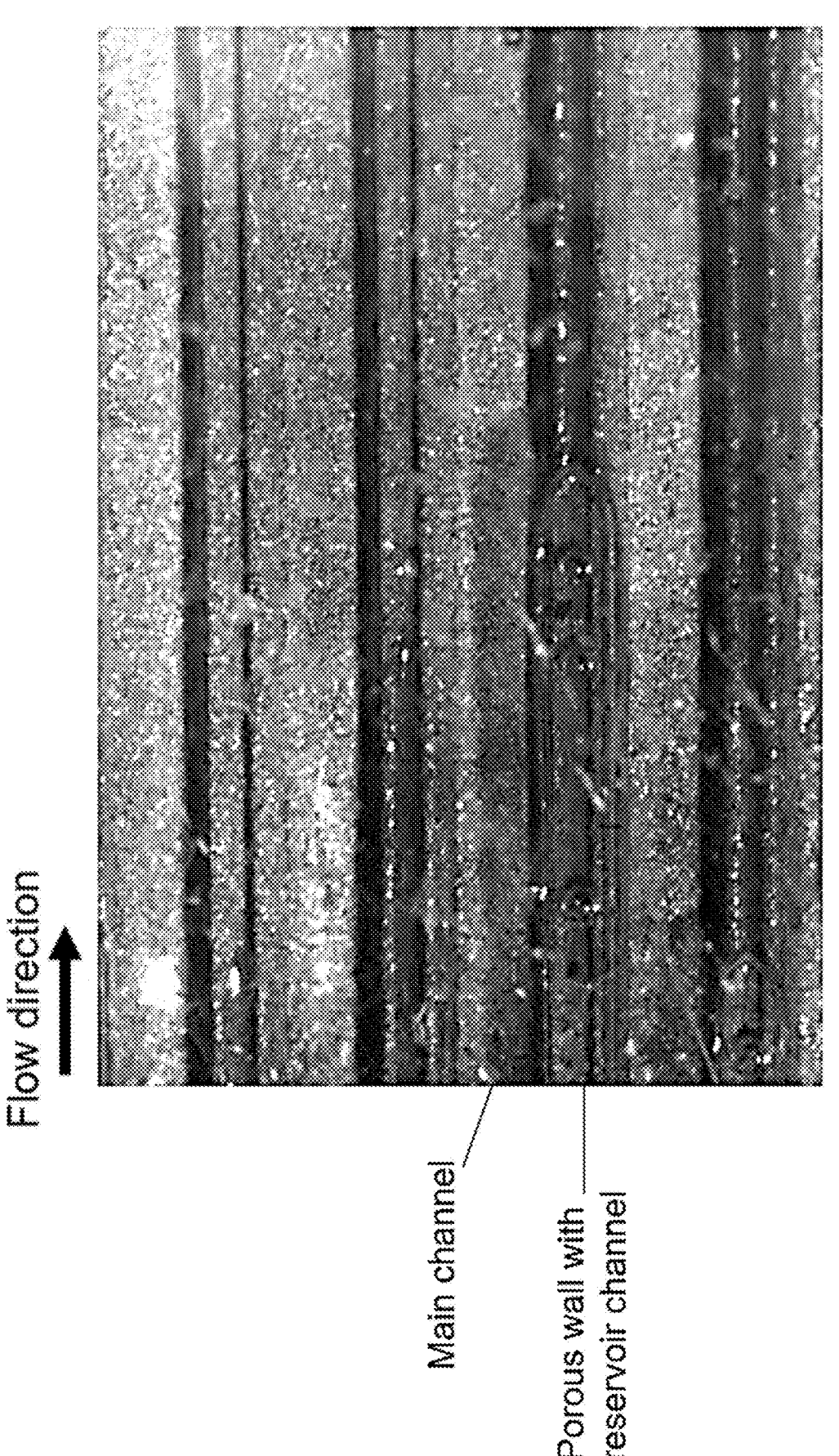
FIG. 10 illustrates a top view visualization of an exemplary device cooled by presently disclosed technology with presently disclosed designed porous minichannel with reservoir channel configuration.

FIG. 10 illustrates a top view visualization of an exemplary device cooled by presently disclosed technology with presently disclosed designed porous minichannel with reservoir channel configuration. The top view visualization of FIG. 10 comes from 50 fps, video taken at 1000 fps, with a left to right flow direction of a device dissipating 550 Watts with a cooling flow rate of 25 ml/min. As shown, a main channel feature is interspersed with a porous wall with reservoir channel feature.

Figure 11A:
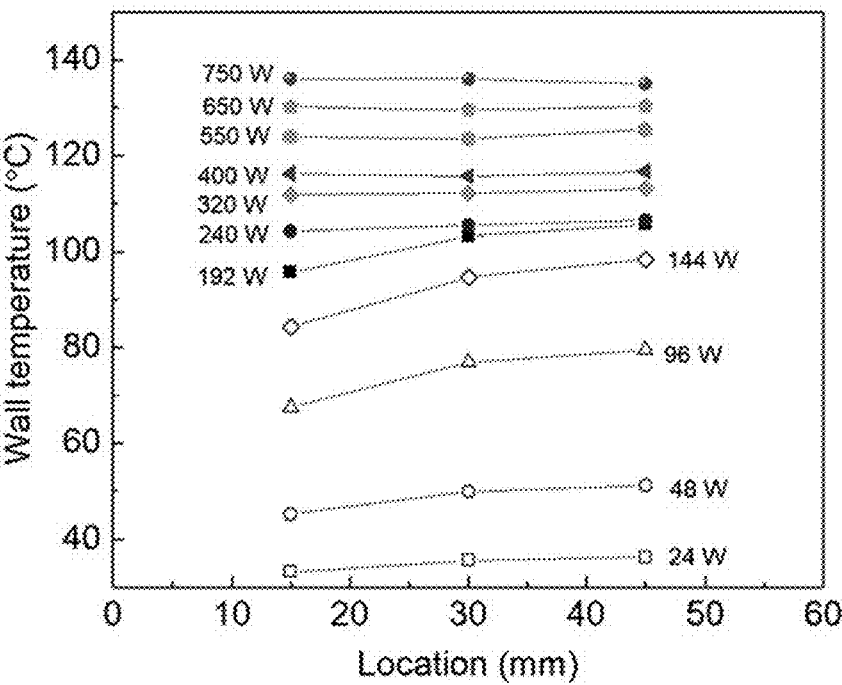
FIGS. 11A and 11B graphically illustrate significantly reduced wall temperatures after improving local liquid spreading through use of presently disclosed embodiments utilizing (11A) minichannels with gaps, and (11B) porous minichannels with reservoir channel.
Figure 11B:
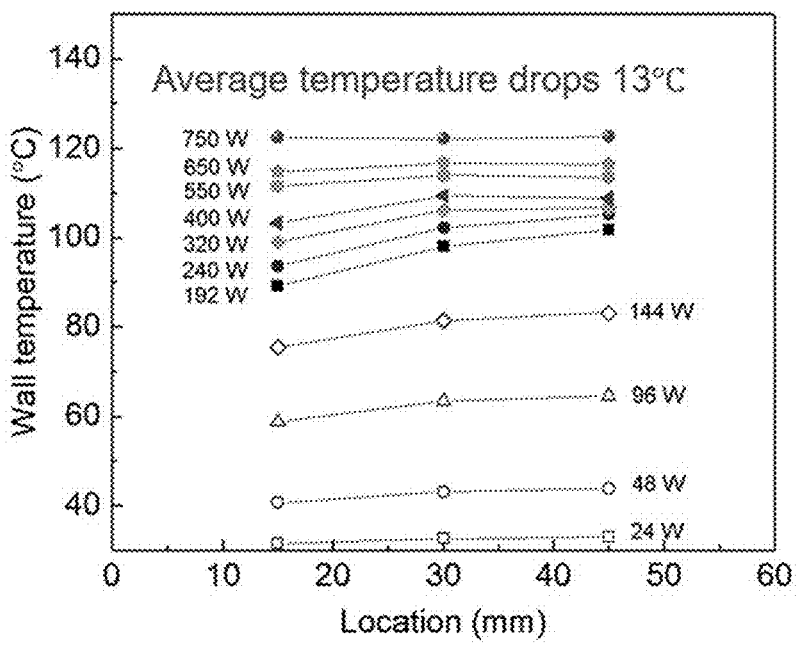

FIGS. 11A and 11B graphically illustrate significantly reduced wall temperatures after improving local liquid spreading through use of presently disclosed embodiments. In particular, FIG. 11A highlights improved results utilizing the presently disclosed embodiment of minichannels with gaps, while FIG. 11B represents improved results from the presently disclosed porous minichannels with reservoir channel configuration. Both graphs chart wall temperature versus location (on the device), per various power dissipation configurations, and both graphs involve embodiments making use of cooling water flowrates of 25 ml/min. While FIG. 11A represents an improvement generally, the FIG. 11B configurations show a further average temperature drop of 13° C.

Figure 12A:
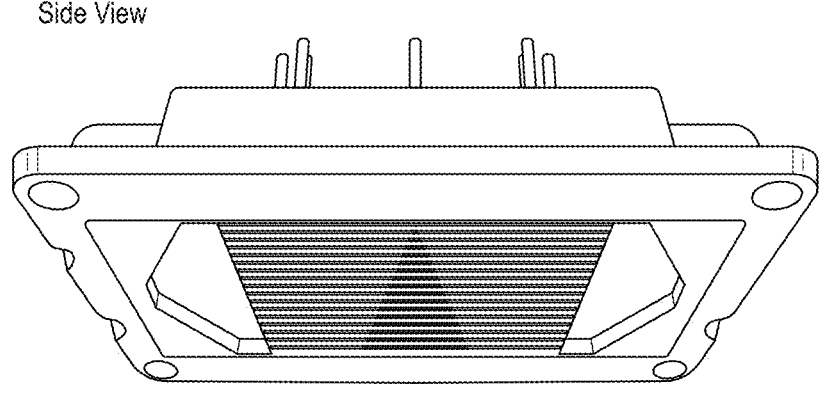
FIGS. 12A and 12B respectively illustrate side and top view images of an exemplary implementation of presently disclosed subject matter, resulting in integrating minichannel cooling on a power module.
Figure 12B:
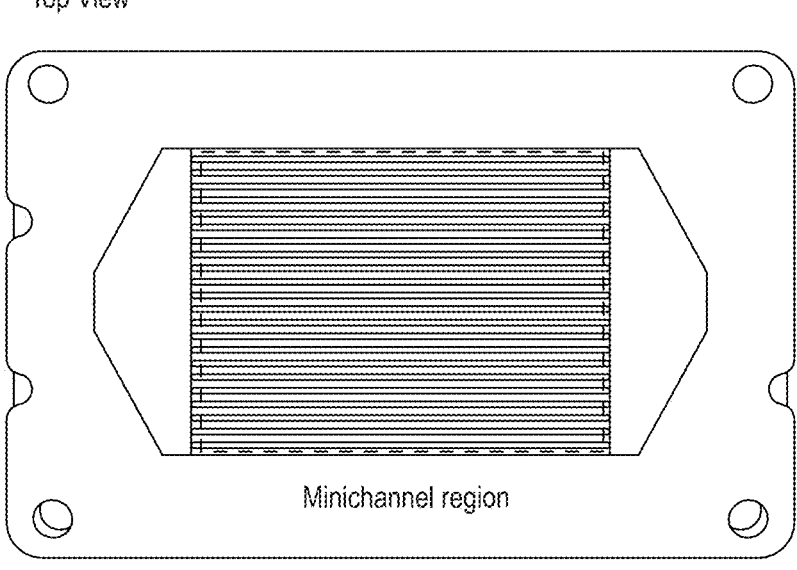

FIGS. 12A and 12B respectively illustrate side and top view images of an exemplary implementation of presently disclosed subject matter, resulting in integrating minichannel cooling on a power module. The top view of FIG. 12B includes a visual augmentation of a dotted-line box to mark the minichannel region of the presently disclosed embodiment.

Figure 13A:
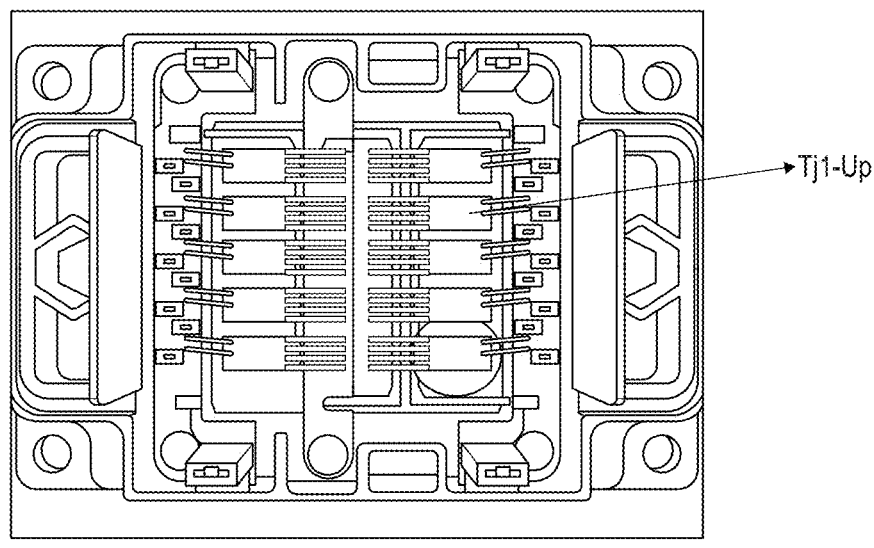
FIG. 13A illustrates an image of a representative exemplary power module cooled by presently disclosed technology.
Figure 13B:
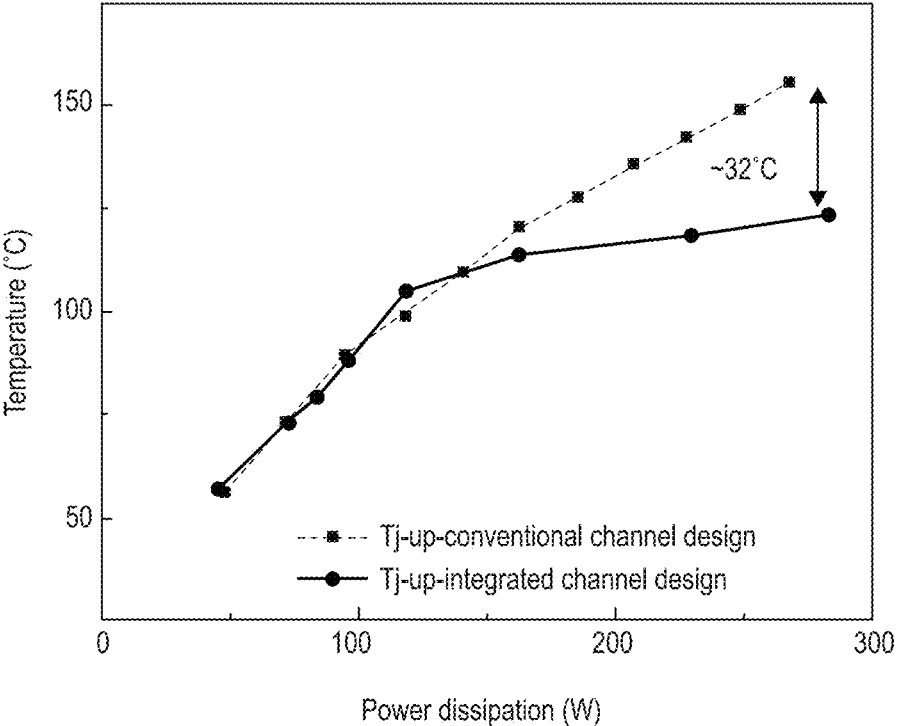
FIG. 13B graphically illustrates drawback of chip temperature for the arrangement of FIG. 13A.

FIG. 13A illustrates an image of a representative exemplary power module cooled by presently disclosed technology, as shown per FIGS. 12A and 12B. FIG. 13B graphically illustrates drawback of chip temperature for the arrangement of FIG. 13A. As shown, the presently disclosed embodiment results in an upper-end of scale chip temperature drawback improvement of about 32° C. versus conventional cooling configurations. Again, the embodiment represented was a Wolfspeed® power module subjected to a cooling water flowrate of 25 ml/min.

Figure 14:
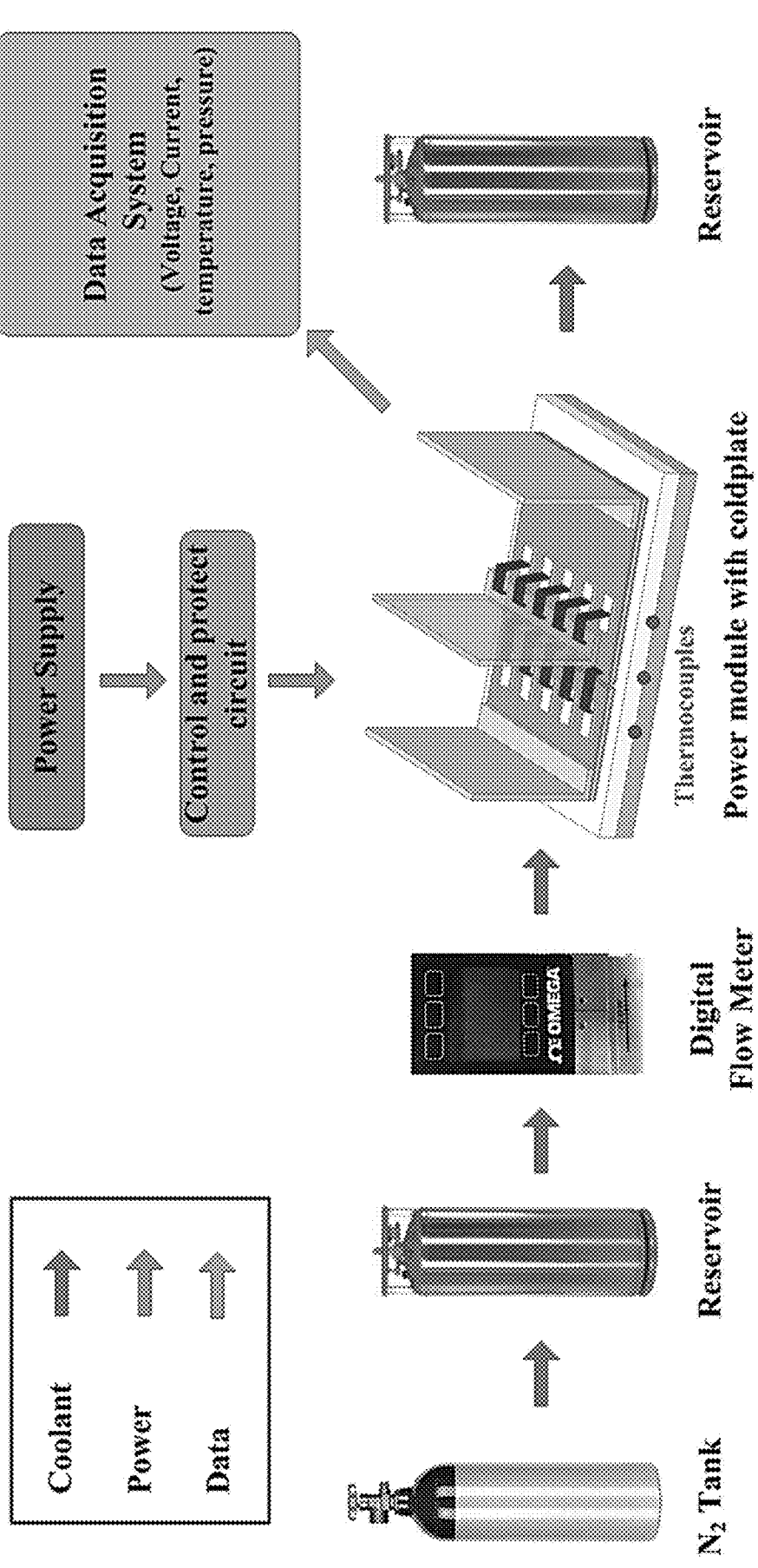
FIG. 14 illustrates a schematic of a representative experimental setup incorporating presently disclosed subject matter.
Figure 15A:
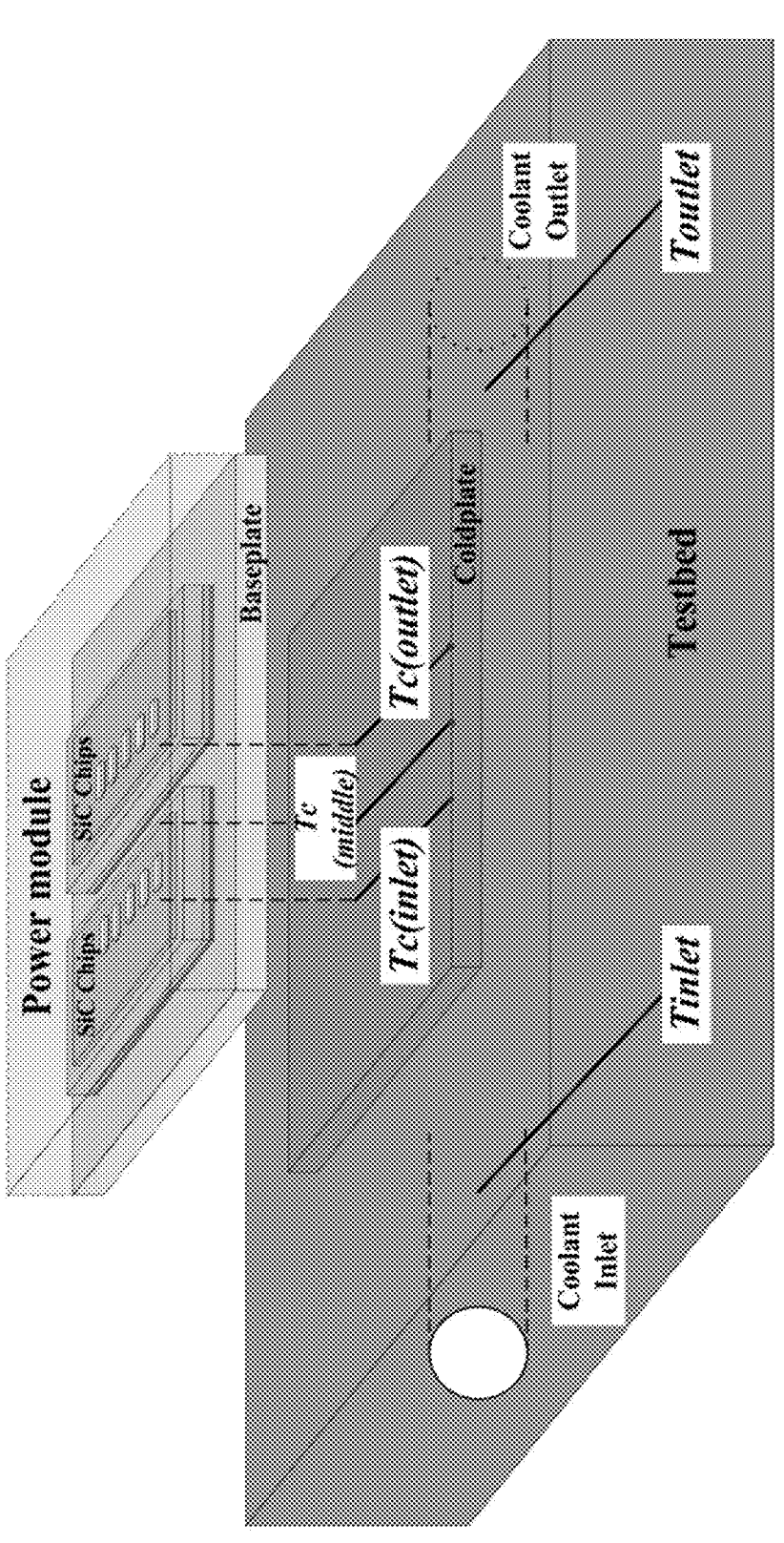
FIG. 15A illustrates a perspective schematic in partial see-through of an exemplary embodiment incorporating presently disclosed subject matter.

FIGS. 14 and 15A represent a presently disclosed experimental setup based on use of a Wolfspeed® SiC power module CAB450M12XM3, rated for 1200V and 450 A operation. In particular, FIG. 14 illustrates a schematic of a representative experimental setup incorporating presently disclosed subject matter, and FIG. 15A illustrates a perspective schematic in partial see-through of an exemplary embodiment setup incorporating presently disclosed subject matter.

Figure 15B:
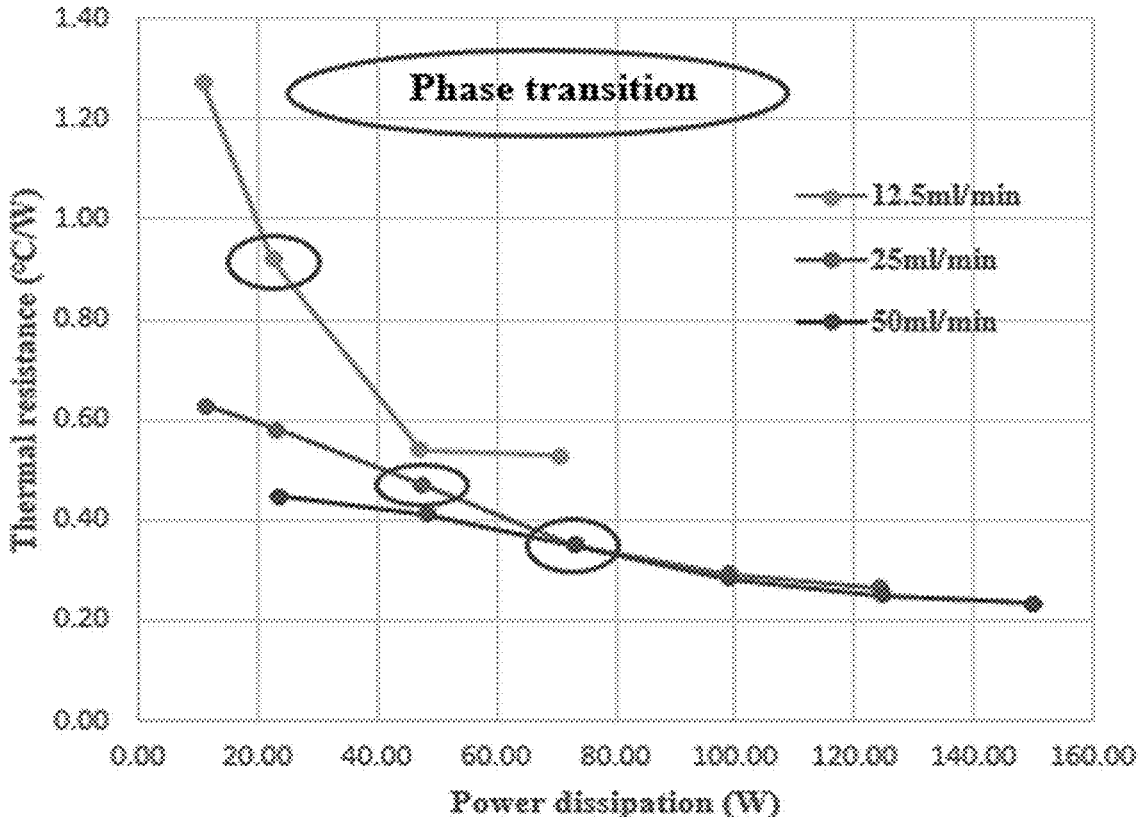
FIG. 15B graphically illustrates certain results regarding thermal resistance versus power dissipation of the representative FIG. 15A embodiment.

FIG. 15B reflects the demonstrated effectiveness of minichannel flow boiling in accordance with presently disclosed technology. In particular, FIG. 15B graphically illustrates certain results regarding thermal resistance versus power dissipation of the representative FIG. 15A embodiment.

Thermal resistance of coldplate $R_{th(cp)}$ is a key parameter to quantify thermal performance directly. The definition is given by the following equation:

$$R_{th(cp)} = [\text{Average}(T_C) - (T_{inlet} + T_{outlet})/2]/P_{diss}$$

$R_{th(cp)}$ for the two-phase cooling (TPC) case (presently disclosed technology) decreases remarkably compared with $R_{th(cp)}$ for single-phase cooling (SPC) case (conventional technology). The minimum of $R_{th(cp)}$ for TPC case is 2.41 times, 2.37 times, and 1.91 times smaller than that for SPC case.

This written description uses examples to disclose the presently disclosed subject matter, including the best mode, and also to enable any person skilled in the art to practice the presently disclosed subject matter, including making and using any devices or systems and performing any incorporated methods. The patentable scope of the presently disclosed subject matter is defined by the claims, and may include other examples that occur to those skilled in the art. While certain embodiments of the disclosed subject matter have been described using specific terms, such description is for illustrative purposes only, and it is to be understood that changes and variations may be made without departing from the spirit or scope of the subject matter.

What is claimed is:

1. Method for achieving effective two-phase cooling on electronic devices having an area of one cm by one cm or larger, comprising integrating at least one minichannel structure directly associated with baseplate features of the electronic devices, wherein the baseplate features comprise a substrate defining at least one minichannel formed between a pair of side walls and a bottom surface thereof,
   the formed minichannel comprises porous wall structures, and
   the formed minichannel and substrate are made from copper sintering.

2. The method according to claim 1, wherein the minichannel is substantially rectangular in cross-section, such that each of the side walls is substantially perpendicular to the bottom surface.

3. The method according to claim 1, wherein the minichannel has width and depth measurements of at least 1 mm by at least 1 mm.

4. The method according to claim 1, wherein the substrate comprises one of brass, copper, a copper alloy, nickel, a nickel alloy, or a combination thereof.

5. The method according to claim 3, wherein each minichannel has a length of at least 60 mm.

6. The method according to claim 1, wherein the electronic devices have an area of up to ten cm by five cm or larger, and the electronic devices comprise commercial electronics or power electronic modules.

7. The method according to claim 1, wherein the side walls of the minichannel form at least one terminal wall for the minichannel, and the method further comprises fabricating a microgap configuration between the terminal wall of the minichannel and a layer adjacent thereto.

8. Th method according to claim 7, wherein capillary flow is induced by said microgap configuration during associated cooling fluid flow, and wherein the microgap configuration has a thickness of up to 460 um.

9. The method according to claim 7, wherein the microgap configuration is at least 60 μm thick.

10. The method according to claim 1, wherein the electronic device is operated for dissipating up to 750 Watts, and associated two-phase cooling uses a cooling water flowrate of between 12.5 and 50 ml/min.

11. The method according to claim 1, wherein the side walls form reservoir channels.

12. The method according to claim 11, wherein the porous wall structures have a porosity of at least 60%, and the reservoir channels are at least 100 um width.

13. The method according to claim 11, wherein the porous wall structures have a porosity of at least 65%, and width of each of the reservoir channels is at least 140 μm, and associated two-phase cooling uses a cooling water flowrate of at least 25 ml/min.

14. Method for achieving effective two-phase cooling on electronic devices having an area of one cm by one cm or larger, comprising defining a plurality of minichannels integrated into a substrate and directly associated with baseplate features of the electronic devices, wherein each minichannel is formed between a pair of side walls and a bottom surface thereof, the side walls of the plurality of minichannels respectively form terminal walls for each of the respective minichannels, the method further comprises fabricating a microgap configuration between the terminal wall of at least one of said plurality of minichannels and a layer adjacent thereto, capillary flow is induced by said microgap configuration during associated cooling fluid flow, and wherein the microgap configuration has a thickness of up to 460 um.

15. Method according to claim 14, wherein each minichannel is substantially rectangular in cross-section.

16. The method according to claim 15, wherein each minichannel has width and depth measurements of at least 1 mm by 1 mm.

17. Method according to claim 14, wherein the substrate comprises one of brass, copper, a copper alloy, nickel, a nickel alloy, or a combination thereof.

18. Method according to claim 14, wherein the substrate and formed minichannel are fabricated through 3-D printing or through copper sintering.

19. Method according to claim 18, wherein the formed minichannel comprises porous wall structures, and the formed minichannel and substrate are made from copper sintering.

20. The method according to claim 14, wherein each minichannel has a length of at least 60 mm.

21. Method according to claim 14, wherein the electronic devices have an area of up to ten cm by five cm or larger, and the electronic devices comprise commercial electronics or power electronic modules.

22. Method according to claim 14, wherein the electronic device is operated for dissipating up to 750 Watts, and associated two-phase cooling uses a cooling water flowrate of between 12.5 and 50 ml/min.

23. The method according to claim 14, wherein the formed minichannels comprise porous wall structures with side walls which form reservoir channels.

24. The method according to claim 23, wherein the porous wall structures have a porosity of at least 60%, and the reservoir channels are at least 100 pm width.

25. The method according to claim 24, wherein the porous wall structures have a porosity of at least 65%, and width of each of the reservoir channels is at least 140 pm, and associated two-phase cooling uses a cooling water flowrate of at least 25 ml/min.

* * * * *